US012617046B2

(12) United States Patent
Heinrich et al.

(10) Patent No.: US 12,617,046 B2
(45) Date of Patent: May 5, 2026

(54) METHOD FOR ATTACHING A FIRST CONNECTION PARTNER TO A SECOND CONNECTION PARTNER

(71) Applicant: Infineon Technologies AG, Neubiberg (DE)

(72) Inventors: Alexander Heinrich, Bad Abbach (DE); Andreas Waterloo, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 652 days.

(21) Appl. No.: 17/699,768

(22) Filed: Mar. 21, 2022

(65) Prior Publication Data
US 2022/0310435 A1 Sep. 29, 2022

(30) Foreign Application Priority Data
Mar. 25, 2021 (EP) .................................... 21164770

(51) Int. Cl.
*H01L 23/00* (2006.01)
*B23K 35/36* (2006.01)

(52) U.S. Cl.
CPC .......... *H01L 24/83* (2013.01); *B23K 35/3618* (2013.01); *H01L 24/27* (2013.01);
(Continued)

(58) Field of Classification Search
CPC ....... H01L 21/6835; H01L 2221/68318; H01L 24/29; H01L 24/32; H01L 25/072;
(Continued)

(56) References Cited

U.S. PATENT DOCUMENTS 5,115,964 A * 5/1992 Ameen ................ H05K 3/3436
257/E23.177
5,145,722 A * 9/1992 Kaspaul ............. B23K 35/3618
428/458
(Continued)

FOREIGN PATENT DOCUMENTS

RU 2488472 C1 * 7/2013
WO 2004011190 A1 2/2004

OTHER PUBLICATIONS

Sawada, H. and Murakami, T. (2000). Oxalic Acid. In Kirk-Othmer Encyclopedia of Chemical Technology, (Ed.). https://doi.org/10.1002/0471238961.1524011219012301.a01 (Year: 2000).*
(Continued)

*Primary Examiner* — Eliseo Ramos Feliciano
*Assistant Examiner* — Brad A Knudson
(74) *Attorney, Agent, or Firm* — Murphy, Bilak & Homiller, PLLC

(57) ABSTRACT
A method includes forming a first tacking layer on a first connection partner, arranging a first layer on the first tacking layer, forming a second tacking layer on the first layer, arranging a second connection partner on the second tacking layer, heating the tacking layers and first layer, and pressing the first connection partner towards the second connection partner, with the first layer arranged between the connection partners, such that a permanent mechanical connection is formed between the connection partners. Either the tacking layers each include a second material evenly distributed within a first material, the second material being configured to act as or to release a reducing agent, or the tacking layers each include a mixture of at least a third material and a fourth material, the materials in the mixture chemically reacting with each other under the influence of heat such that a reducing agent is formed.

17 Claims, 3 Drawing Sheets

(52) U.S. Cl.
CPC .............. *H01L 24/29* (2013.01); *H01L 24/32*
(2013.01); *H01L 24/73* (2013.01); *H01L
2221/68318* (2013.01); *H01L 2224/29005*
(2013.01); *H01L 2224/29083* (2013.01); *H01L
2224/291* (2013.01); *H01L 2224/29109*
(2013.01); *H01L 2224/29111* (2013.01); *H01L
2224/29113* (2013.01); *H01L 2224/29116*
(2013.01); *H01L 2224/29139* (2013.01); *H01L
2224/29144* (2013.01); *H01L 2224/32225*
(2013.01); *H01L 2224/83894* (2013.01); *H01L
2224/83907* (2013.01)

(58) Field of Classification Search
CPC . H01L 2224/29005; H01L 2224/29083; H01L
2224/291; H01L 2224/83024; H01L
2224/83075; H01L 2224/8309; H01L
2224/83203; H01L 24/83; H01L 24/27;
H01L 24/73; H01L 2224/29109; H01L
2224/29111; H01L 2224/29113; H01L
2224/29116; H01L 2224/29139; H01L
2224/29144; H01L 2224/32225; H01L
2224/83894; H01L 2224/83907; B23K
1/008; B23K 20/026; B23K 35/3618

See application file for complete search history.

(56) References Cited

U.S. PATENT DOCUMENTS

| | | | |
|---|---|---|---|
| 6,409,070 B1 * | 6/2002 | Master ................... | B23K 1/203 |
| | | | 228/102 |
| 7,781,323 B2 | 8/2010 | Shimokawa et al. | |
| 9,111,922 B2 | 8/2015 | Andou | |
| 2004/0000355 A1 * | 1/2004 | Suga ................... | B23K 35/3612 |
| | | | 148/25 |
| 2004/0007610 A1 * | 1/2004 | Suga ...................... | B23K 1/008 |
| | | | 228/123.1 |
| 2007/0228112 A1 | 10/2007 | Shi et al. | |
| 2008/0156398 A1 * | 7/2008 | Yasuda ................... | H01L 24/30 |
| | | | 148/23 |
| 2013/0299815 A1 * | 11/2013 | Jackson .............. | H10K 10/462 |
| | | | 257/40 |
| 2016/0111395 A1 * | 4/2016 | Heinrich .......... | H01L 23/49513 |
| | | | 438/107 |
| 2016/0168422 A1 * | 6/2016 | Iwai ........................... | C09J 4/06 |
| | | | 522/182 |
| 2018/0326545 A1 * | 11/2018 | Hayashi ............. | B23K 35/3613 |
| 2020/0219848 A1 | 7/2020 | Heinrich | |

OTHER PUBLICATIONS

Chang, Chia-Shou, et al., "Self-Assembly of Microchips on Substrates", 2006 Electronic Components and Technology Conference, 56th San Diego, 2006, pp. 1533-1538.

* cited by examiner

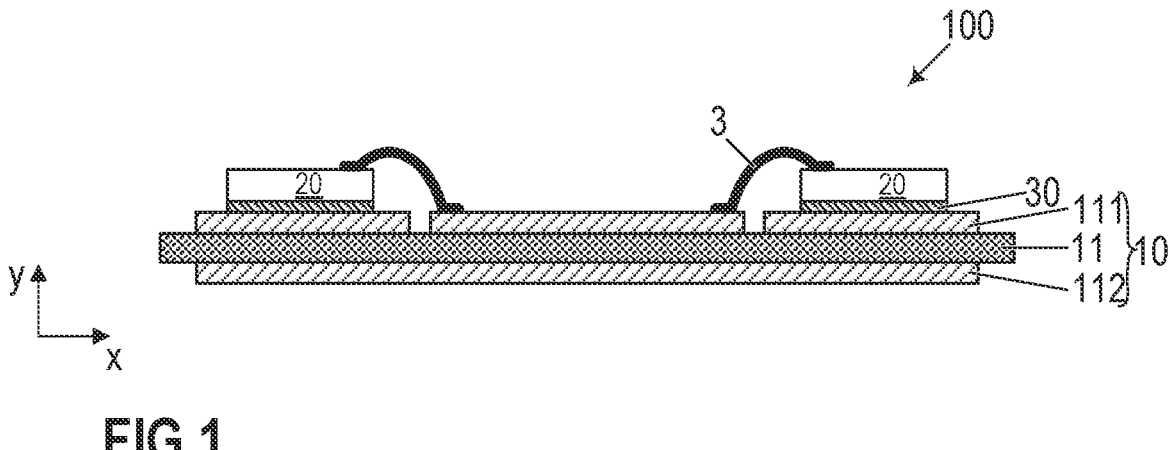
FIG 1
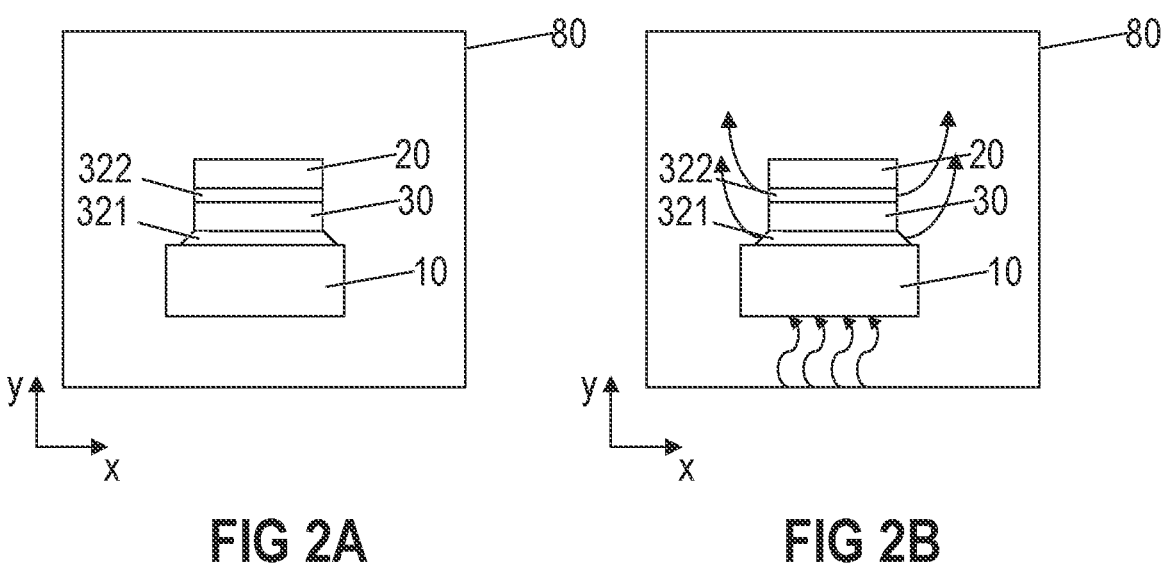
FIG 2A                    FIG 2B

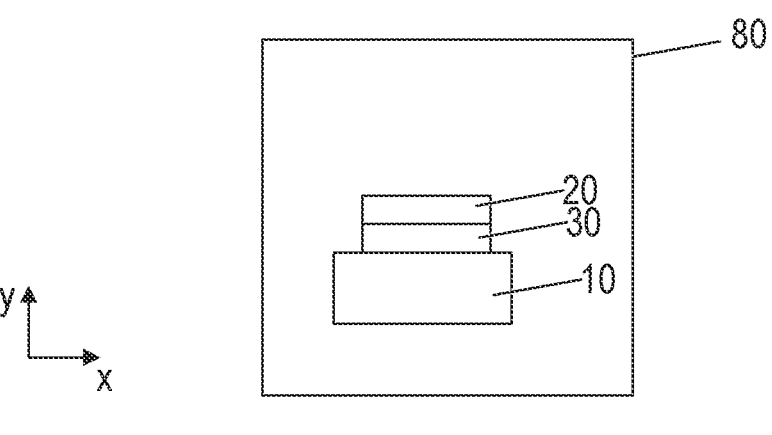
FIG 2C
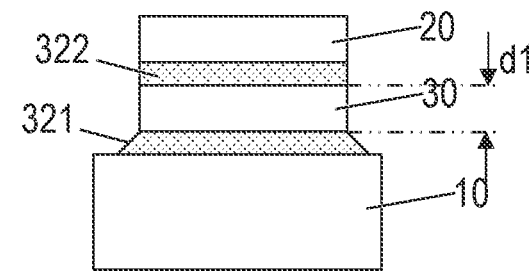
FIG 3
FIG 4

METHOD FOR ATTACHING A FIRST CONNECTION PARTNER TO A SECOND CONNECTION PARTNER

TECHNICAL FIELD

The instant disclosure relates to a method for attaching a first connection partner to a second connection partner.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. Before permanently attaching the semiconductor elements to the substrate, the substrate often needs to be transported from one manufacturing facility to another. For transport between different manufacturing facilities, the semiconductor elements can be temporarily attached to the substrate. A solder preform can be arranged between the substrate and the semiconductor element, the solder preform being attached to the substrate by means of a layer formed by a so-called tacking agent, and the semiconductor device being attached to the solder preform by means of a further layer of tacking agent. When forming the permanent connection between the semiconductor device and the substrate by means of the solder preform, the layers of tacking agent have to be removed without any residues and, at the same time, a surface of the substrate needs to be activated. That is, a metal oxide that might have formed on the surface of the substrate needs to be reduced to pure metal.

There is a need for a method for attaching a first connection partner to a second connection partner.

SUMMARY

A method includes forming a first tacking layer on a second connection partner, arranging a first layer on the first tacking layer, forming a second tacking layer on the first layer, arranging a first connection partner on the second tacking layer, and heating the first tacking layer, the second tacking layer, and the first layer, and pressing the first connection partner towards the second connection partner, with the first layer arranged between the first connection partner and the second connection partner, thereby forming a permanent mechanical connection between the first connection partner and the second connection partner, wherein either the first and second tacking layers each include a first material and a second material evenly distributed within the first material, wherein the second material is configured to act as or to release a reducing agent, or the first and second tacking layers each include a mixture of at least a third material and a fourth material, wherein the materials comprised in the mixture chemically react with each other under the influence of heat, thereby forming a reducing agent.

An arrangement includes a first tacking layer arranged on a second connection partner, a first layer arranged on the first tacking layer, a second tacking layer arranged on the first layer, and a first connection partner arranged on the second tacking layer, wherein either the first and second tacking layers each include a first material and a second material evenly distributed within the first material, wherein the second material is configured to act as or to release a reducing agent, or the first and second tacking layers each include a mixture of at least a third material and a fourth material, wherein the materials comprised in the mixture chemically react with each other under the influence of heat, thereby forming a reducing agent.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIG. 1 is a cross-sectional view of a power semiconductor module arrangement.

FIGS. 2A to 2C schematically illustrate a method for attaching a semiconductor device to a substrate according to one example.

FIG. 3 schematically illustrates an arrangement in which a semiconductor body is temporarily attached to a substrate.

FIG. 4 schematically illustrates a chemical reaction cascade for forming oxalic acid.

DETAILED DESCRIPTION

Figure 5A:
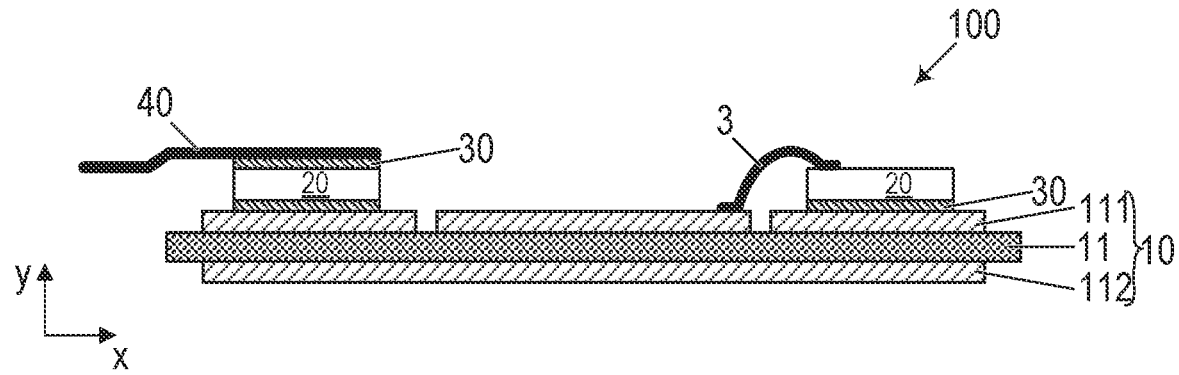
FIGS. 5A and 5B schematically illustrate an arrangement in which a semiconductor body is permanently (FIG. 5A) or temporarily (FIG. 5B) attached to a substrate, and in which an electrical connection is permanently (FIG. 5A) or temporarily (FIG. 5B) attached to a semiconductor body.

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Referring to FIG. 1, a cross-sectional view of a power semiconductor arrangement 100 is illustrated. The power semiconductor arrangement 100 includes a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112. The second metallization layer 112, however, is optional and can be omitted.

Each of the first and second metallization layers 111, 112 can consist of or include one of the following materials: copper; a copper alloy; aluminum; an aluminum alloy; any other metal or alloy that remains solid during the operation of the power semiconductor arrangement. The substrate 10 can be a ceramic substrate, that is, a substrate in which the dielectric insulation layer 11 is a ceramic, e.g., a thin ceramic layer. The ceramic can consist of or include one of the following materials: aluminum oxide; aluminum nitride; zirconium oxide; silicon nitride; boron nitride; or any other dielectric ceramic. For example, the dielectric insulation layer 11 can consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 can be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 can be filled with ceramic particles, for example. Such particles can comprise, e.g., $Si_2O$, $Al_2O_3$, AlN, or BN and can have a diameter of between about 1 μm and about 50 μm. The substrate 10 can also be a conventional printed circuit board (PCB) having a non-ceramic dielectric insulation layer 11. For instance, a non-ceramic dielectric insulation layer 11 can consist of or include a cured resin.

The substrate 10 can be arranged in a housing (not specifically illustrated). One or more semiconductor bodies 20 can be arranged on the substrate 10. Each of the semiconductor bodies 20 arranged on the substrate 10 can include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 can form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. Different semiconductor bodies 20 can be mounted to the same or to different sections of the first metallization layer 111. Different sections of the first metallization layer can have no electrical connection or can be electrically connected to one or more other sections using, e.g., bonding wires 3. Electrical connections 3 can also include bonding ribbons, connection plates, connection clips, or conductor rails, for example, to name just a few examples. The one or more semiconductor bodies 20 can be electrically and mechanically connected to the substrate 10 by an electrically conductive connection layer 30. Such an electrically conductive connection layer can be a solder layer, for example.

The electrically conductive connection layer 30 illustrated in FIG. 1 forms a permanent mechanical connection between the semiconductor body 20 and the substrate 10.

During the assembly of the power semiconductor arrangement 100, a plurality of semiconductor bodies 20 as well as other components is mounted to the substrate 10. Different components are often mounted to the substrate 10 in separate manufacturing steps. In between the different manufacturing steps, the substrate 10 is often transported between different manufacturing sites and/or different manufacturing tools. The semiconductor bodies 20, for example, can be placed on the substrate 10 in one manufacturing step. A permanent connection between the semiconductor bodies 20 and the substrate 10, however, can be formed in a subsequent step by a separate manufacturing tool. When placing the semiconductor bodies 20 on the substrate 10, a temporary connection can be formed between each of the semiconductor bodies 20 and the substrate 10. This temporary connection can be configured to prevent the semiconductor bodies 20 from shifting out of place when the substrate 10 with the semiconductor bodies 20 arranged thereon is transported to another processing chamber or manufacturing site. A permanent mechanical connection between the semiconductor bodies 20 and the substrate 10 can be formed in a subsequent step.

As is schematically illustrated in FIG. 2A, a first layer is arranged between the semiconductor body 20 and the substrate 10. This first layer will subsequently form an electrically conductive connection layer 30 and is therefore designated with the same reference numeral, even if in the state illustrated in FIG. 2A a permanent mechanical connection has not yet been formed. The first layer 30 is attached to the substrate 10 by means of a first tacking layer 321. The first tacking layer 321 forms a temporary connection between the first layer 30 and the substrate 10. The semiconductor body 20 is temporarily attached to the first layer 30 by means of a second tacking layer 322.

The tacking layers 321, 322 are liquid or viscous and attach the first layer 30 to the substrate 10, and the semiconductor body 20 to the first layer 30 due to their surface tension. It is, however, generally still possible to remove the semiconductor body 20 and the first layer 30 by applying a comparably small amount of force without damaging any of the components, or to relocate the semiconductor body 20 and the first layer 30 to a certain degree.

According to one example, the first and the second tacking layer 321, 322 comprise a first material and a second material evenly distributed within the first material, wherein the second material is configured to act as or to release a reducing agent. A resulting arrangement is schematically illustrated in FIG. 3, with the second material indicated by the dots in the first and second tacking layers 321, 322. The second material can comprise a carboxylic acid such as formic acid, for example. The first material can be a volatile and inert material that evaporates under the influence of heat without residues. According to one example the first material comprises carbon, oxygen, fluorine, nitrogen, and hydrogen. Examples for such materials include, but are not limited to, Perfluorotributylamine, Perfluorotripentylamine, and Perfluorpolyether. Perfluorotributylamine has a boiling temperature of 178° C., Perfluorotripentylamine has a boiling temperature of 215° C., and Perfluorpolyether has a boiling temperature of 140° C. to 290° C. These materials are generally liquid, pasty or viscous at room temperature. In this way, the first layer 30 and the semiconductor body 20, by means of the surface tension of the first material, can be temporarily attached to the substrate 10 and the first layer 30, respectively. Under the influence of heat (boiling temperature of the respective first material or higher), the first material evaporates, leaving only the second material but no other residues. This is schematically illustrated by means of FIGS. 2B and 2C. The second material can be mixed into the first material with a low concentration. For example, the content of second material in the mixture can be between 30% and 60%.

In FIG. 2B the step of applying heat to the first tacking layer 321, the second tacking layer 322, and the first layer 30 is schematically illustrated. Usually, heat is applied to the entire arrangement comprising the substrate 10, the tacking layers 321, 322, the first layer 30, and the semiconductor body 20. The first material evaporates when heat is applied to the arrangement. At the same time while applying heat to the arrangement, the semiconductor body 20 can be pressed on the substrate 10, with the first layer 30 arranged between the semiconductor body 20 and the substrate 10. As the first layer 30 is also heated and melts to a certain degree, a permanent connection can be formed between the semiconductor body 20 and the substrate 10 when the first layer 30 subsequently cools down and hardens. This permanent connection can be a solder connection, for example. The arrangement after the formation of the permanent connection is schematically illustrated in FIG. 2C.

The second material which remains between the first layer 30 and the substrate 10, and between the first layer 30 and the semiconductor body 20, can be configured to activate the surfaces of the substrate 10, the first layer 30, and/or the semiconductor body 20. "Activating" a surface in this context refers to the reduction of a metal oxide that may have formed on the surface to pure metal. As has been described above, the first metallization layer 111 of the substrate comprises a metal. The first layer 30 can also comprise a metal such as, e.g., tin, lead, silver, bismuth, indium, gold, and germanium. The semiconductor body 20 can comprise a bonding pad on its bottom side, the bonding pad comprising a metal. A bottom side of the semiconductor body 20 is a side which faces the substrate 10. When a reducing agent (e.g., formic acid) comes into contact with a metal layer and further under the influence of heat, a thin metal oxide layer that may have formed on the respective metal layer (e.g., first metallization layer 111, first layer 30, bonding pad of semiconductor body 20) is reduced to pure metal.

According to another example, the tacking layers 321, 322 comprise a mixture of at least a third material and a fourth material. The mixture of at least two different materials disaggregates into at least a fifth and a sixth material when exposed to heat. The fifth material can be a reducing agent such as carboxylic acid or formic acid, for example. The sixth material and any other materials formed during the decay of the mixture can be volatile and can evaporate during the process. That is, the tacking layers 321, 322 vanish under the influence of heat, the only remaining residue being the fifth material. The fifth material which remains between the first layer 30 and the substrate 10, and between the first layer 30 and the semiconductor body 20, can be configured to activate the surfaces of the substrate 10, the first layer 30, and the semiconductor body 20.

According to one example, the mixture of at least a third material and a fourth material comprises glycerol and oxalic acid. Under the influence of heat, e.g., temperatures of 110° C. or more, glycerol mono-oxalate is formed, which further disintegrates into carbon dioxide $CO_2$ and glycerol mono-formate. Subsequently, by means of hydrolysis, glycerol and formic acid are formed. This reaction is schematically illustrated in FIG. 4. This, however is only one example of how a reducing agent such as, e.g., formic acid can be derived from a mixture of at least two different materials under the influence of heat. Any other suitable materials can be used for the first and second tacking layer 321, 322 that can form a temporary connection between the concerned components of a power semiconductor module arrangement, wherein a reducing agent is formed under the influence of heat and wherein all other materials that are formed by the resulting chemical reaction evaporate without leaving any residues on the surfaces.

The process of heating the first and second tacking layers 321, 322 and the first layer 30 can be performed in a process chamber 80. An atmosphere in the process chamber 80 can be a "normal" atmosphere. A "normal" atmosphere in this context is an atmosphere that comprises essentially an inert gas, but does not comprise formic acid. According to another example, a vacuum can be generated inside the process chamber 80. As a reducing agent is already present in the first and second tacking layers 321, 322, or is formed during the step of heating the first and second tacking layers 321, 322, it is not necessary to provide an atmosphere comprising an additional reducing agent inside the process chamber 80.

The first layer 30 can comprise a metal foil, for example. As has been described above, the first layer 30 can comprise at least one of, e.g., tin, lead, silver, bismuth, indium, gold, and germanium. The first layer 30 can have a thickness d1 in a vertical direction y of 50 µm (micrometer) or less, 25 µm or less, or even 15 µm or less. The vertical direction y is a direction perpendicular to a main surface of the first layer 30, wherein the main surface of the first layer 30 is a surface on which the first tacking layer 321 or the second tacking layer 322 is formed. The first layer 30, therefore, can be a comparably thin layer. As a reducing agent is already present in the first and second tacking layers 321, 322, or a reducing agent (e.g., carboxylic acid or formic acid) is formed while dissolving the first and second tacking layers 321, 322 during the heating process, the reducing agent (e.g., carboxylic acid or formic acid) reaches all surfaces regardless of the thickness d1 of the first layer 30. Therefore, all surfaces can be activated even if the first layer 30 is comparably thin. The activation of the surfaces enables the formation of a void-free electrically conducting connection layer 30.

In the examples described above, a first tacking layer 321 is formed between the substrate 10 and the first layer 30, and a second tacking layer 322 is formed between the first layer 30 and the semiconductor body 20. It is, however, also possible to omit either the first tacking layer 321 or the second tacking layer 322. That is, according to one example, an arrangement comprises a semiconductor body 20 arranged on a substrate 10, with a first layer 30 arranged between the semiconductor body 20 and the substrate 10. A first tacking layer 321 is arranged between the substrate 10 and the first layer 30. The first layer 30 in this example directly adjoins the semiconductor body 20. For example, the first layer 30 may be formed on and directly adjoin a bottom surface of the semiconductor body 20, the first tacking layer 321 may be formed on and directly adjoin the substrate 10, and the semiconductor body 20 with the first layer 30 arranged thereon may be arranged on the first tacking layer 321.

According to another example, an arrangement comprises a semiconductor body 20 arranged on a substrate 10, with a first layer 30 arranged between the semiconductor body 20 and the substrate 10. A second tacking layer 322 is arranged between the first layer 30 and the semiconductor body 20. The first layer 30 in this example directly adjoins the substrate 10. For example, the first layer 30 may be formed on and directly adjoin the substrate 10. The second tacking layer 322 may be formed on and directly adjoin the first layer 30, and the semiconductor body 20 may be arranged on and directly adjoin the second tacking layer 322. In all cases (arrangement comprises only the first tacking layer 321, or only the second tacking layer 322, or both), a permanent mechanical connection between the semiconductor body 20 and the substrate 10 is formed when heat is applied to the arrangement and the semiconductor body 20 is pressed towards the substrate 10. The only difference between the different arrangements is that either the surface of the substrate 10 is activated, or the surface of the semiconductor body 20 is activated, or both the surface of the substrate 10 and the surface of the semiconductor body 20 are activated.

A corresponding method for forming the arrangement may comprise arranging a semiconductor body 20 on a substrate 10, with a first layer 30 arranged between the semiconductor body 20 and the substrate 10, forming a first tacking layer 321 between the substrate 10 and the first layer 30, or a second tacking layer 322 between the first layer 30 and the semiconductor body 20, or both, and heating the first tacking layer 321, or the second tacking layer 322, or both, and the first layer 30, and pressing the semiconductor body 20 towards the substrate 10, thereby forming a permanent mechanical connection between the semiconductor body 20 and the substrate 10, wherein either the first and second tacking layers 321, 322 each comprise a first material and a second material evenly distributed within the first material, wherein the second material is configured to act as or to release a reducing agent, or the first and second tacking layers 321, 322 each comprise a mixture of at least a third material and a fourth material, wherein the materials comprised in the mixture chemically react with each other under the influence of heat, thereby forming a reducing agent.

Similar to what has been described above, an electrical connection can be permanently attached to a semiconductor body. More and more applications today use so-called connection clips for electrically coupling a semiconductor body to other components of a power semiconductor module arrangement or to a pin, wherein the pin extends to an outside of a housing to allow the semiconductor body to be electrically contacted. An electrical connection 40 such as, e.g., a connection clip, is schematically illustrated in the arrangement of FIG. 5A. The electrical connection 40 is arranged on the semiconductor body 20 such that the semiconductor body 20 is arranged between the electrical connection 40 and the substrate 10. An additional first layer 30 is arranged between the electrical connection 40 and the semiconductor body 20 and permanently couples the electrical connection 40 to the semiconductor body 20. The arrangement of FIG. 5A otherwise corresponds to the arrangement that has been described with respect to FIG. 1 above.

Figure 5B:
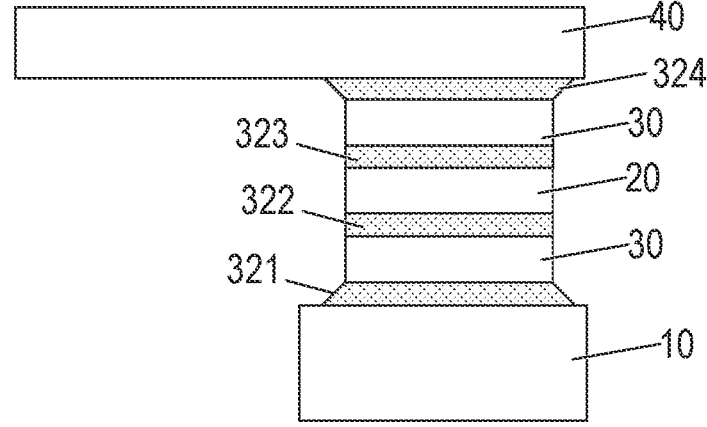

Now referring to FIG. 5B, the arrangement is schematically illustrated before the permanent connection is formed. In addition to the elements described with respect to FIG. 3 above, the arrangement illustrated in FIG. 5B comprises an electrical connection 40 arranged on the semiconductor body 20, with an additional first layer 30 arranged between the electrical connection 40 and the semiconductor body 20. A third tacking layer 323 is arranged between the semiconductor body 20 and the additional first layer 30, and a fourth tacking layer 324 is arranged between the additional first layer 30 and the electrical connection 40. As has been described above, either the third tacking layer 323 or the fourth tacking layer 324 can be omitted. The third tacking layer 323 and the fourth tacking layer 324 can comprise the same materials that have been described with respect to the first tacking layer 321 and the second tacking layer 322 above.

In addition to the steps that have been described with respect to FIGS. 2A through 2C above, a method can comprise arranging an electrical connection 40 on the semiconductor body 20, with an additional first layer 30 arranged between the electrical connection 40 and the semiconductor body 20, forming a third tacking layer 323 between the semiconductor body 20 and the additional first layer 30, or a fourth tacking layer 324 between the additional first layer 30 and the electrical connection 40, or both, and heating the third tacking layer 323, or the fourth tacking layer 324, or both, and the additional first layer 30, and pressing the electrical connection 40 towards the semiconductor body 20, thereby forming a permanent mechanical connection between the electrical connection 40 and the semiconductor body 20, wherein either the third and fourth tacking layers 323, 324 each comprise a first material and a second material evenly distributed within the first material, wherein the second material is configured to act as or to release a reducing agent, or the third and fourth tacking layers 323, 324 each comprise a mixture of at least a third material and a fourth material, wherein the materials comprised in the mixture chemically react with each other under the influence of heat, thereby forming a reducing agent.

The step of heating the third tacking layer 323, or the fourth tacking layer 324, or both, and the additional first layer 30, and pressing the electrical connection 40 towards the semiconductor body 20 can be carried out simultaneously or subsequently to the step of heating the first tacking layer 321, or the second tacking layer 322, or both, and the first layer 30, and pressing the semiconductor body 20 towards the substrate 10.

The method and the arrangement have been described by means of specific examples above, namely a semiconductor body arranged on a substrate and an electrical connection arranged on a semiconductor body. However, it is generally possible to attach any other connection partners to each other.

What is claimed is:

1. A method, comprising:

arranging a first connection partner on a second connection partner, with a first layer arranged between the first connection partner and the second connection partner;

forming at least one of a first tacking layer between the second connection partner and the first layer and a second tacking layer between the first layer and the first connection partner; and heating the first layer and the at least one of the first tacking layer and the second tacking layer, and pressing the first connection partner towards the second connection partner such that a permanent mechanical connection is formed between the first connection partner and the second connection partner, wherein each of the at least one of the first tacking layer and the second tacking layer comprises a first material and a second material evenly distributed within the first material, the second material being configured to act as or to release a reducing agent, wherein the first material completely evaporates during the heating the first layer and the at least one of the first tacking layer and the second tacking layer, and wherein the second material remains after evaporation of the first material.

2. The method of claim 1, wherein the reducing agent comprises a carboxylic acid.

3. The method of claim 1, wherein the second material is evenly distributed within the first material, and wherein the first material is a volatile and inert material that evaporates under the influence of heat without residues.

4. The method of claim 1, wherein the second material is evenly distributed within the first material, and wherein the first material comprises carbon, oxygen, fluorine, nitrogen and hydrogen.

5. The method of claim 4, wherein the first material comprises one of Perfluorotributylamine, Perfluorotripentylamine, and Perfluorpolyether.

6. The method of claim 1, wherein the second material is evenly distributed within the first material, and wherein the reducing agent comprises formic acid.

7. The method of claim 1, wherein the heating of the first layer and the at least one of the first tacking layer and the second tacking layer is performed in a process chamber, and wherein an atmosphere inside the process chamber comprises essentially an inert gas or a vacuum is formed inside the process chamber.

8. The method of claim 1, wherein the first layer comprises a metal.

9. The method of claim 1, wherein the first layer has a first thickness in a vertical direction of 50 µm or less, wherein the vertical direction is a direction perpendicular to a main surface of the first layer, and wherein the main surface is a surface on which the at least one of the first tacking layer and the second tacking layer is formed.

10. The method of claim 1, wherein a top surface of the second connection partner on which the first tacking layer is formed comprises a metal, and wherein when heating the first tacking layer, the reducing agent that is present in or is formed from the first tacking layer activates the top surface of the second connection partner, and wherein activating the top surface of the second connection partner comprises reducing a metal oxide layer formed on the top surface of the second connection partner to pure metal.

11. The method of claim 1, wherein a bottom surface of the first connection partner adjacent to the second tacking layer comprises a metal, and wherein when heating the second tacking layer, the reducing agent that is present in or is formed from the second tacking layer activates the bottom surface of the first connection partner, and wherein activating the bottom surface of the first connection partner comprises reducing a metal oxide layer formed on the bottom surface of the first connection partner to pure metal.

12. An arrangement, comprising:
   a first connection partner arranged on a second connection partner;
   a first layer arranged between the first connection partner and the second connection partner; and
   at least one of a first tacking layer arranged between the second connection partner and the first layer and a second tacking layer arranged between the first layer and the first connection partner,
   wherein
      each of the at least one of the first tacking layer and the second tacking layer comprises a first material and a second material evenly distributed within the first material, the first material being configured to completely evaporate upon an application of sufficient heat, the second material being configured to remain after evaporation of the first material and to act as or to release a reducing agent.

13. The arrangement of claim 12, wherein:
   either the first connection partner is a semiconductor body and the second connection partner is a substrate; or
   the first connection partner is an electrical connection and the second connection partner is a semiconductor body.

14. A method, comprising:
   arranging a first connection partner on a second connection partner, with a first layer arranged between the first connection partner and the second connection partner;
   forming a first tacking layer between the second connection partner and the first layer and a second tacking layer between the first layer and the first connection partner; and
   heating the first layer, the first tacking layer, and the second tacking layer, and pressing the first connection partner towards the second connection partner such that a permanent mechanical connection is formed between the first connection partner and the second connection partner,
   wherein
      each of the first tacking layer and the second tacking layer comprises a first material and a second material evenly distributed within the first material, the second material being configured to act as or to release a reducing agent, wherein the first material completely evaporates during the heating the first layer and the at least one of the first tacking layer and the second tacking layer, and wherein the second material remains after evaporation of the first material.

15. The method of claim 14, wherein the second material is evenly distributed within the first material, and wherein the first material is a volatile and inert material that evaporates under the influence of heat without residues.

16. The method of claim 14, wherein the second material is evenly distributed within the first material, and wherein the first material comprises carbon, oxygen, fluorine, nitrogen and hydrogen.

17. The method of claim 14, wherein the second material is evenly distributed within the first material, and wherein the reducing agent comprises formic acid.

* * * * *